United States Patent [19]
Bijlenga et al.

[11] Patent Number: 6,021,036
[45] Date of Patent: *Feb. 1, 2000

[54] METHOD AND DEVICE IN POWER TRANSISTOR

[75] Inventors: Bo Bijlenga, Skultuna; Peter Lundberg, Västerås; Anders Persson, Västerås; Lennart Zdansky, Västerås, all of Sweden

[73] Assignee: ABB Research Ltd., Zurich, Switzerland

[*] Notice: This patent is subject to a terminal disclaimer.

[21] Appl. No.: 09/135,572

[22] Filed: Aug. 18, 1998

Related U.S. Application Data

[62] Division of application No. 08/739,999, Oct. 30, 1996, Pat. No. 5,828,539.

[30] Foreign Application Priority Data

Sep. 20, 1996 [SE] Sweden .................................. 9603432

[51] Int. Cl.⁷ ...................................................... H02H 3/00
[52] U.S. Cl. .............................. 361/100; 361/93; 361/115
[58] Field of Search ................................ 361/115, 93, 18, 361/42, 70, 71, 72, 23, 24, 100

[56] References Cited

U.S. PATENT DOCUMENTS

| | | | |
|---|---|---|---|
| 4,540,893 | 9/1985 | Bloomer | 307/248 |
| 4,947,063 | 8/1990 | O'Shaughnessy et al. | 307/572 |
| 5,077,651 | 12/1991 | Kobayshi et al. | 363/56 |
| 5,204,562 | 4/1993 | Pace | 307/571 |
| 5,828,539 | 10/1998 | Bijlenga | 361/93 |

FOREIGN PATENT DOCUMENTS

| | | | |
|---|---|---|---|
| 0 250 719 | of 1987 | European Pat. Off. | H02H 3/00 |
| 2 258 380 | of 1972 | Germany | H02H 3/00 |
| 24 08 962 | of 1974 | Germany | H02H 3/00 |
| 7409160-4 | of 1974 | Sweden | H02H 3/00 |
| 2 140 996 | of 1984 | United Kingdom | H03K 17/00 |
| WO 95/28767 | of 1995 | WIPO | H03K 17/16 |
| WO 97/12443 | of 1997 | WIPO | H03K 17/08 |

*Primary Examiner*—Stephen W. Jackson
*Attorney, Agent, or Firm*—Pollock, Vande Sande & Amernick

[57] ABSTRACT

A method and a device for controlling a switching operation consisting of a turn on or a turn off operation in a voltage controlled power transistor is provided. At least one current source is arranged at the control electrode of the power transistor. The at least one current source controls the recharging of at least one of the capacitances which occurs between the control electrode of the power transistor and the main electrode of the power transistor to determine the time rate of change of at least one of the voltage and current.

34 Claims, 4 Drawing Sheets

METHOD AND DEVICE IN POWER TRANSISTOR

This application is a divisional of U.S. patent application Ser. No. 08/739,999 filed on Oct. 30, 1996 now U.S. Pat. No. 5,828,539.

BACKGROUND OF THE INVENTION

1. Technical Field

The invention relates to drives for power transistors, wherein the drive is used for controlling a power transistor during a turn-on, turn-off and current-limiting operation.

2. Description of Related Art

Self-commutated converters are presently used in a number of applications, for example in static converters for motor drives, supply devices, UPS systems, etc. In such applications, an individual power transistor is normally used for taking up the relatively high voltages occurring.

There are a number of types of power transistors, the most common being MOSFET and IGBT transistors, bipolar transistors and Darlington transistors. The principles of drives disclosed through this description can be applied to all types of power transistors, but this description is substantially directed to drives in connection with voltage-controlled power transistors such as IGBTs. In the following, when referring to the electrodes of a power transistor, the designations gate, emitter and collector are used, wherein the term emitter encompasses the word "source" used in MOSFET literature and, correspondingly, the term collector encompasses the word "drain".

The following description describes a few different reasons for the desire to control the turn-on and turn-off operations in power transistors. In this connection, the concept dv/dt control and the concept di/dt control will be used. These concepts refer to methods which make it possible to control or limit the voltage derivative and the current derivative, respectively, in connection with turn-on and turn-off of the transistor. The concepts turn-on and turn-off are used as designations for switching the power transistor on and off, respectively.

During turn-on of a power transistor, for example an IGBT, the turn-on process is controlled by controlling the gate of the IGBT to prevent overload of a reverse-voltage diode (opposite diode) associated with the IGBT and caused by too fast current growth (di/dt) or too fast voltage breakdown (dv/dt) across the power transistor. This is of particularly great importance for diodes of a higher voltage ($\geq 1600$ V). High-voltage diodes normally have a relatively large recovery charge due to a relatively high charge-carrier lifetime. This, in combination with a low doping level in the high-field region, makes the diode more sensitive to dynamic avalanche or avalanche injection during turn-on, which may be harmful to the diode. This leads to a need to limit the amount of a current derivative (di/dt), which is negative during the turn-on operation, and the voltage growth (dv/dt) to values which are acceptable to the diode. This can be done by turning on the opposite transistor smoothly, that is, by maintaining the voltage derivative at the gate low. At the same time, it is desired to keep the turn-on losses for the power transistor and the turn-off losses for the diode as small as possible.

During turn-off of the power transistor, control via the gate is used to check the voltage growth (dv/dt) for several different reasons. By means of dv/dt control it is possible to limit the amplitude of that voltage overshoot which always occurs upon turn-off of a current in an inductive circuit. This may be necessary to limit the stresses on the transistor in accordance with what is stated in the data sheets of the transistor. Control of the voltage derivative is also normally necessary upon turn-off of the power transistor when a short circuit or so-called arc-through occurs (in connection with current limiting of the power transistor). Without control or limitation of the voltage derivative (dv/dt), the transistor device can easily be damaged during turn-off of a short-circuit pulse because of the fact that high peak voltages otherwise easily arise.

When utilizing IGBTs of higher voltages (e.g. IGBTs in the voltage range $\geq 1600$ V), there are, in addition, other difficulties. The SOA (Safe Operating Area) of the IGBT becomes dependent on the voltage derivative at which turn-off occurs. By limiting the voltage derivative, higher currents can be turned off or, alternatively, higher peak voltages can be tolerated. This can be explained by the fact that dv/dt control, which is correctly performed, results in the electron injection continuing for a considerable part of the turn-off operation, which suppresses the process which creates a dynamic avalanche such that higher currents/voltages can be tolerated during the turnoff operation than what would otherwise be the case.

Dv/dt control can also be used to limit dv/dt to which a load (e.g. a motor) is subjected, for a high dv/dt may entail local stresses on an insulation in the load, which may successively break down the insulation. Likewise, high voltage derivatives, dv/dt, may give rise to voltage transients which are transmitted out on a cable, are reflected and may generate voltage spikes which may result in insulation problems. High dv/dt values may also give rise to radio interference or disturb other electronic equipment. To fulfil the EMC standards (EMC=Electrom Magnetic Compatibility), it may be necessary to design filters which reduce these disturbances. Dv/dt control may then be an aid in attacking the problem, so to speak, at the source.

A negative factor to be considered is that control of the voltage derivative dv/dt normally increases the turn-on and turn-off losses to a certain extent. With full control of the turn-on and turn-off operations, however, the losses may be minimized. There is always an optimum way which the transistor can be turned on and turned off, respectively, if the aim is to minimize the turn-on and turn-off losses, respectively. One condition is that this optimum way is known and that the control parameters can be adapted such that the transistor is always turned on/turned off in this optimum way.

There are also other reasons why it is desirable to control the turn-on and turn-off operations of a power transistor. One such case where particularly high demands are made on the control is during series connection of transistors. During such series connection of power transistors, where individual transistors are intended to take up part of a high voltage by voltage division, there are a number of factors to consider. Some of the most important problems which have to be solved are:

static voltage division;
dynamic voltage division; and
voltage division under short-circuit conditions.

Of these above-mentioned problems, the primary task of this description is to seek a solution to the question of how dynamic voltage division is achieved in an optimum way, that is, during turn-on and turn-off of the transistor. Various proposed methods for this are known. Among other things, there are several different methods whereby external voltage-dividing elements are used, for example a combination of a diode, a resistor, and a capacitor. These methods, however, do not result in a solution to the problem at the source but only result in an attempt to limit the differences in voltages which arise across individual transistor modules in a chain of series-connected transistors to a level which may be tolerated, by adding external components. This increases both the volume and the cost of, for example, a device in the form of a converter designed in accordance with such known principles.

In currently used converters, a very simple method of controlling or limiting dv/dt and di/dt, respectively, is normally used. A common way is that, during turn-on of the transistor, the gate is connected to a voltage source by means of a resistor, a so-called gate resistor. This resistor will limit the current delivered by the voltage source, whereby, by a suitable choice of resistor, it is possible to influence how fast the turn-on occurs. In the same way, a combination of a voltage source and another resistor may be used to influence how fast the turn-off is to occur. This method is simple and frequently used, but it only provides limited control possibilities. During turn-on of the transistor, it is not possible to influence di/dt and dv/dt, respectively, separately. Likewise, for example, the voltage derivative during turn-off is greatly dependent on at which current the turn-off occurs (the higher the current, the greater the voltage derivative). To avoid too high a voltage overshoot during turn-off of short-circuit currents, a method is often used in which it is first detected whether the on-state voltage of the transistor exceeds a given level. If this is the case, the current is judged to be so high that turn-off must be performed smoothly, that is, with a reduced voltage derivative, which means that turn-off is carried out with a higher gate resistance than what is normally the case.

The turn-off and turn-on operations at a given current are also dependent on the temperature of the transistor. Further, large variations in the turn-off and turn-on operations may occur when different specimens of transistors of the same type are tested with the same drive. Such variations may give problems with transient current division in case of parallel connection of transistors and with transient voltage division in case of series connection of transistors. Thus, there is a need of a method which in a better way can make possible control of the turn-on and turn-off operations, respectively, of power transistors, partly with the aim of controlling the process better in its details to achieve a more optimum turn-on and turn-off, partly with the aim of reducing the dependence of the turn-on and turn-off operations on current, temperature and naturally occurring variations of transistors of the same type.

Because the known solutions are not the optimum solutions to meet various requirements, the use of an "intelligent" drive, shown according to the invention, for control of a power transistor, such as an IGBT, in its so-called linear or controllable region during switching is proposed. The solution of the present invention is somewhat more complicated than the method which is most commonly used today involving adaptation of the so-called gate resistors, but the costs incurred therefor in many applications may be more than worthwhile since the power transistors may be utilized more efficiently due to a more optimum control.

SUMMARY OF THE INVENTION

The concept of the present invention is based partially on the fact that the gate-charge characteristic of a power transistor is known during switching of the transistor at different collector voltages and that this characteristic does not vary greatly between different specimens of the same power transistor. This is of special importance in a device which comprises a number of power transistors cooperating in a circuit, for example in a high-voltage valve with series-connected power transistors or in a high-current valve with parallel-connected power transistors.

During switching of a power transistor, a certain charge has to be added to (or removed from) the gate in order to cause the transistor to change between the on and off positions. By controlling the charging current during switching operations of the power transistor, it is possible to control the switching-on and switching-off operations (here called the turn-on and turn-off operations, respectively). Attempting to control the charging current in such a method by using a voltage source and a resistor connected to the gate is not particularly advantageous. The magnitude of the charging current and its time-dependence are then dependent on a number of factors, for example the leakage inductance between the gate and the power transistor, the internal gate resistance which is often applied by the manufacturer internally in the transistor module, the threshold voltage of the transistor, on the crystal temperature of the transistor, and the main current through the power transistor.

A method, according to one aspect of the invention, is to supply to the gate a well controlled (e.g. current-source) charging current by means of a controllable current source when the working point of the transistor runs through the current-limiting (usually called the linear) part of the characteristic of the transistor. To obtain better control of the collector voltage and the voltage derivative, dv/dt, it is also advantageous to increase and linearize the Miller capacitance of the transistor by introducing an extra capacitor between the collector and the gate. This capacitor must generally be damped to prevent oscillations.

The above described technique according to the invention offers many advantages for controlling transistors with an MOS gate, such as IGBT transistors. Further, the technique permits control of the transistor during switching and current-limiting operations and the object thereof is to minimize the switching losses, to increase the Safe Operating Area (SOA) or ensure in a reliable manner that the transistor is always located within SOA, to offer a reliable method for short-circuit protection, to limit dv/dt, if desired, in a load, or to simplify EMC protection, to provide good current division during parallel connection of power transistors, and to provide good voltage division during series connection of power transistors.

The technique is extremely suitable for controlling high-voltage IGBTs (1600 V and above), since a good control of the behavior of such a transistor during switching increases its SOA while at the same time switching losses can be minimized. However, the technique may also be used for other MOS-controlled power transistors, such as IGBTs and MOSFET transistors of lower voltage.

During turn-off of a power transistor, it may be of great importance to control the voltage derivative dv/dt for different values of collector voltage, that is, that the voltage derivative with respect to the time may be given different values for different collector voltages. At a low collector voltage, it is normally advantageous with a high value of this voltage derivative in order to keep the switching losses low. At a high collector voltage, on the other hand (around nominal voltage or thereabove), it may be desirable to reduce the voltage growth, that is, to limit the voltage derivative to a lower value. A limitation of the voltage derivative at this higher voltage will also increase what is usually designated SSOA (Switching Safe Operating Area), that is, the safe operating area during switchings of the transistor. In addition, this may be used during series connection of transistors for the purpose of improving the dynamic voltage division. By limiting the voltage derivative to a very low value as soon as the voltage of the transistor exceeds a certain level, the maximum voltage picked up by the transistor in connection with a turn-off process may be limited.

According to another aspect of the invention, the voltage derivative is controlled to be dependent on the collector voltage in that a current source connected to the gate of the power transistor is controlled by the collector voltage across it. A voltage divider is used to sense the collector voltage, whereby the sensed voltage is used to control the value of the current delivered by the current source. This means that the drive where the variable current source is included is adapted to the most suitable turn-off operation. If, for example, the transistor is turned off in one case where a current limitation is imposed on the device in which the transistor is included, that is, when a high collector voltage occurs across the transistor even before the turn-off operation is started, the drive of the gate can automatically sense this and slowly turn-off the transistor (with a low voltage derivative) in order to maintain the transistor within a safe operating area.

The capacitance with which the above-mentioned controlling current source cooperates may, in principle, consist of the self-capacitance of the power transistor between the gate and the emitter. To create a better linearity and better control of the function, however, a capacitance is preferred which is substantially determined by a capacitor, connected in parallel with the self-capacitance of the power transistor, between the gate and the collector.

The type of control described above is almost independent of the load. This means that full control of the turn-off operation is enjoyed independently of the current through the load.

According to still another aspect of the invention, during turn-on of the power transistor, both the current derivative and the voltage derivative (relating to current and voltage, respectively, between the main electrodes of the transistor, the emitter and the collector), are controlled substantially independently of each other. The voltage of the gate is changed with the aid of a current source connected to the control electrode in such a way that the gate-emitter capacitance is charged. At a certain voltage level, $V_{th}$, the power transistor starts to conduct. During the time of current growth (di/dt), the current through the transistor is controlled by the voltage of the gate. Since, according to the invention, a capacitor which supplies an extra capacitance (in addition to the self-capacitance of the transistor) has now normally been connected between the gate and the emitter, this capacitor starts being charged as soon as the turn-on operation is initiated. In order not to increase unnecessarily the turn-on delay and the charge required for the turn-on operation, a Zener diode may be placed in series with the capacitor, which Zener diode starts conducting when the voltage of the gate is approximately equal to $V_{th}$. This is done by selecting a Zener diode which starts conducting at a suitable voltage. The total capacitance between the gate and the emitter (the external capacitor together with the self-capacitance of the transistor), together with the magnitude of the gate current, determines the derivative of the voltage between the gate and the emitter, which in turn determines the current derivative (di/dt) across the transistor. By selecting the value of the extra capacitor between the gate and the emitter, the current derivative may be reduced to the desired amount. During normal turn-on (no short circuit), the current derivative is controlled in the way mentioned until the collector current reaches the peak value ($i_{pk}$) determined by the load and the opposite diode (see FIG. 4). At this time, the voltage ($v_{CE}$) across the transistor starts falling. Now, according to the invention, the voltage derivative dv/dt is instead controlled by means of the current source (intended for the turn-on operation) in combination with the capacitance between the collector and the gate.

The current sources intended for turn-on and turn-off, respectively, are voltage-limited, which means that the current therefrom drops towards zero when the voltage of the gate has reached the desired value for static on and off positions, respectively, of the controlled transistor.

In a series connection, for example, the invention makes it possible for an arbitrary number of power transistors to be series-connected in a valve, because the control device according to the invention is limiting for a high voltage growth across individual transistors in the series.

DETAILED DESCRIPTION OF THE PREFERRED EMBODIMENT(S)

A number of embodiments of the invention will be described with reference to the accompanying drawings.

Figure 1:
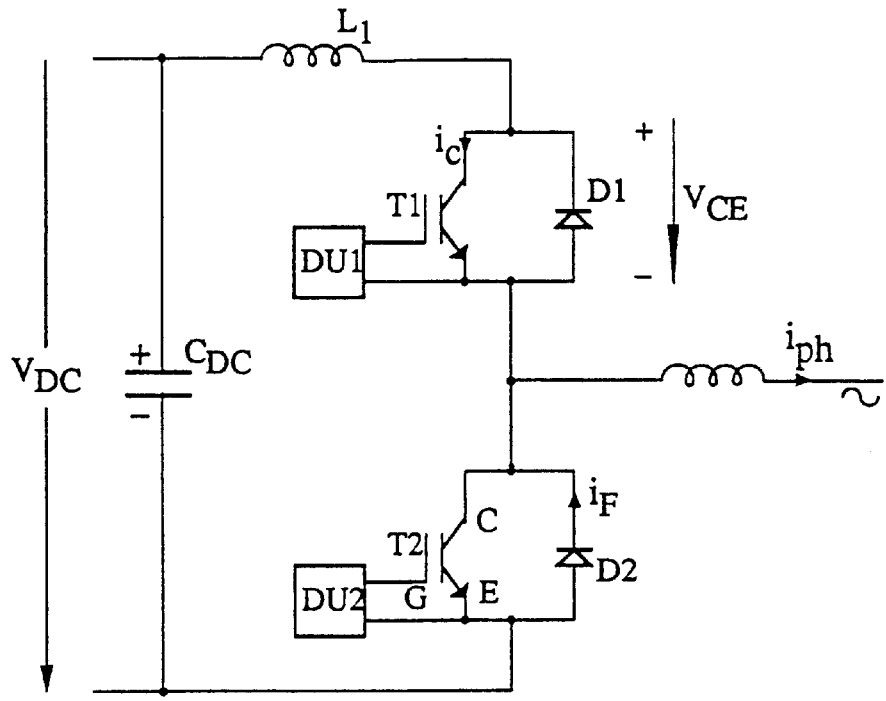
FIG. 1 shows, according to the prior art, a bridge connection with two IGBTs and two opposite diodes, wherein the bridge connection may constitute a branch for a phase in a three-phase inverter.

One typical field of use of the invention is during control of a bridge connection as shown in FIG. 1. This figure shows a prior art bridge connection with two power transistors in the form of two IGBTS (T1 and T2) and their opposite diodes (D2 and D1, respectively). The designations used in the description are clear from the figure. A direct voltage $V_{DC}$ is supplied to the bridge for conversion in two valves, each comprising a power transistor T1 and T2, respectively. The current which flows through a power transistor, for example T1, is assigned the designation $i_c$, whereas the current which flows through the opposite diode, for example D2, is designated $i_F$. The voltage across a transistor is designated $v_{CE}$. In the loop through the intermediate-link capacitor $C_{DC}$, T1 and D2 (or $C_{DC}$, T2 and D1), there is normally no intentional inductance, but an unavoidable stray inductance, here designated L1, influences the turn-on and turn-off operations. The converted current out of the bridge is designated $i_{ph}$ ($i_{phase}$). The drives for the transistors T1 and T2 have the designations DU1 and DU2, respectively.

Figure 2:
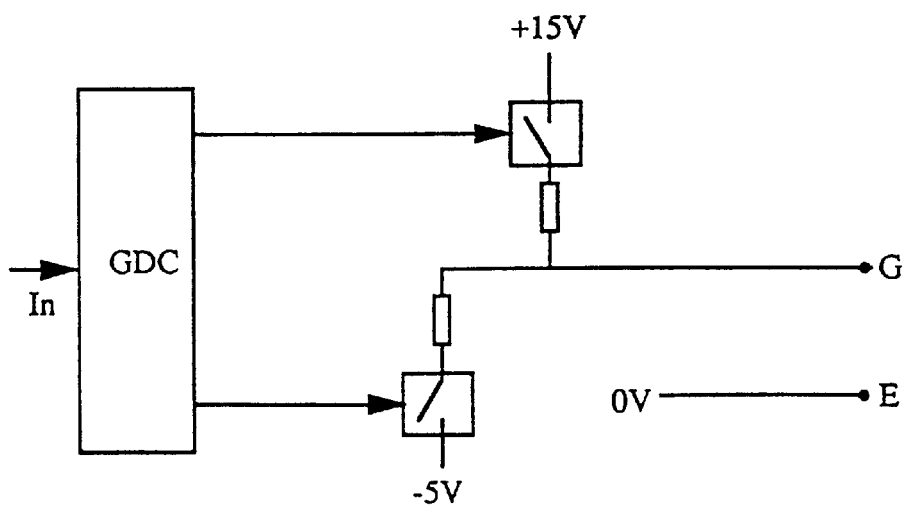
FIG. 2 shows a conventional drive circuit for an IGBT, wherein the setting of the turn-on operation and the turn-off operation is done by selecting the respective gate resistor to a value suitable for the transistor and for the application.

FIG. 2 shows an example of a drive which, according to the conventional technique, controls a power transistor, for example an IGBT. The control is carried out such that a control unit GDC controls two switches synchronously to alternately connect the gate G of the transistor to +15 V and −5 V, respectively, via separate series resistors.

Figure 5:
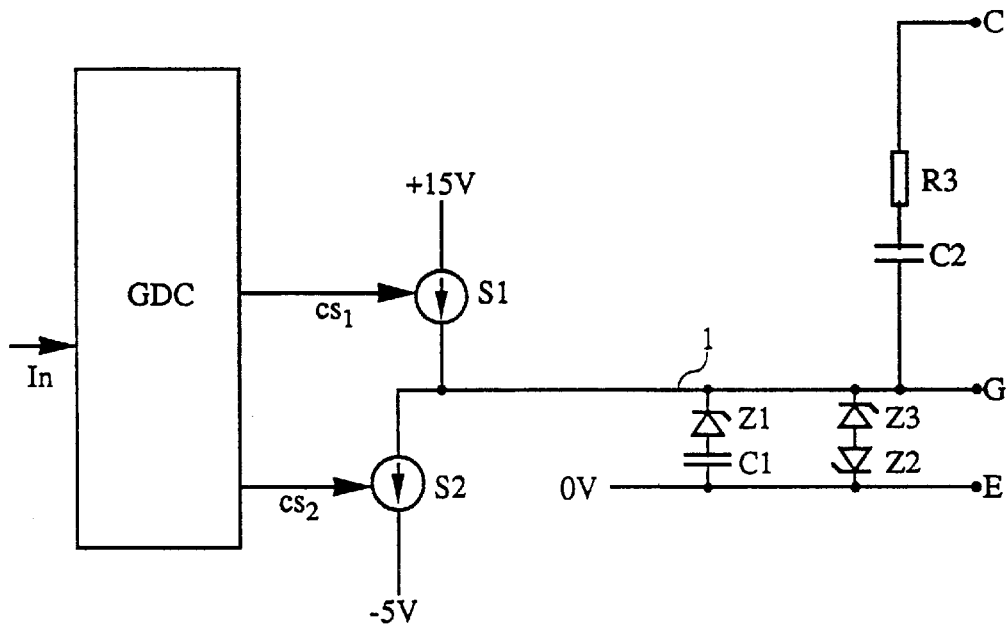
FIG. 5 illustrates an embodiment for control of the power transistor according to the invention, wherein fixed values of di/dt and dv/dt for turn-on and dv/dt for turn-off have been selected in advance.

A drive which constitutes one embodiment of the invention is illustrated in FIG. 5. The designations C, G, E at the extreme right in the figure relate to the collector, gate and emitter, respectively, of a power transistor which is to be controlled with the drive according to the figure.

According to the example, the emitter E is connected to the zero-voltage line of the drive. The gate G is connected by means of a first current source S1 to a driving voltage of +15 V. This first current source S1 is controlled to feed current to the contact line 1 of the gate G. The current from the current source S1 will thereby charge the capacitance which exists between the gate G and the emitter E. This capacitance may be in the form of a self-capacitance between the above-mentioned electrodes, but preferably a capacitor C1 is used, connected between the gate and the emitter, as complement to the self-capacitance in case it is desired to be able to freely set both di/dt and dv/dt largely independently of each other. In series with the capacitor C1 there is a Zener diode Z1 between the emitter and the gate. In the simplest embodiment of the invention, this Zener diode is omitted, but in that case the current source S1 must deliver a somewhat larger charge.

Figure 4:
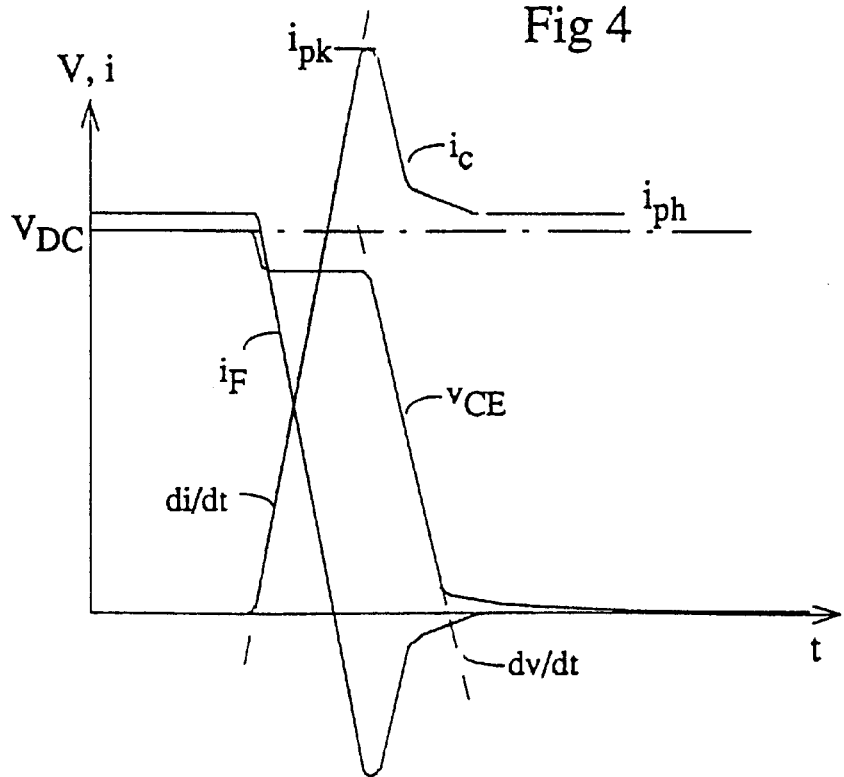
FIG. 4 shows an example of control of di/dt and dv/dt independently of each other during turn-on of an IGBT to reduce the turn-on losses without exceeding the permissible amount for the negative current derivative of the opposite diode.

The current source S1 is controlled by means of a gate drive controller (GDC) to deliver current while turning on the power transistor which is controlled by the drive, whereby the voltage rises on the contact line of the gate. As mentioned, at a certain voltage level, $V_{th}$, the power transistor will then carry current. Depending on the choice of the value of the Zener diode Z1, this Zener diode becomes conducting at a voltage which is approximately equal to $V_{th}$. In this way, the capacitor C1 starts to be charged in parallel with the internal capacitance of the transistor between the gate and the emitter. Therefore, the capacitor C1 will limit the rate at which the voltage vg grows between the gate G and the emitter E, which in turn determines how rapidly the collector current of the transistor grows. The choice of the capacitance value of the capacitor C1 will thus determine the magnitude of the current derivative during turn-on of the power transistor (see FIG. 4) when it is situated in its current-limiting (linear) working range, provided that the transistor is turned on in a substantially inductive circuit.

After turn-on of the power transistor, a collector current $i_c$ will flow between its main electrodes (C, E), whereby the current increases to a peak value, $i_{pk}$, which is determined by the load and the opposite diode. From now on, the current of the power transmitter is not controlled by the gate G. Instead, the voltage $V_{CE}$ will drop and the voltage derivative dv/dt, that is, the voltage breakdown across the power transistor is controlled with the aid of the capacitance which occurs between the collector C and the gate G. According to the invention, this capacitance could also, in principle, consist of a self-capacitance. However, also in this case, it is advantageous to switch in an external capacitance between the collector and the gate in the form of a capacitor C2. This capacitance linearizes the internal Miller capacitance, which makes the voltage derivative largely proportional to the gate current (see FIG. 4). The value of the capacitance of this capacitor C2 will then, in combination with the magnitude of the control current, be controlling with respect to the magnitude of the voltage derivative dv/dt.

In order to be able to control also a turn-off operation of the power transistor in the desired way, the gate G, according to one embodiment of the invention, is further connected to a second current source S2, which communicates with a driving voltage of, for example, −5V. This second current source S2 is controlled to feed current to the contact line 1 of the gate. The current source S2 then delivers a negative current which recharges the capacitance which occurs between the collector and gate of the transistor. Also during turn-off it is possible to allow the capacitance between the collector and gate to consist of the self-capacitance. However, to obtain better control of the turn-off operation, it is advantageous to switch an external capacitor C2 in parallel with the self-capacitance between the gate G and the collector C.

Figure 3:
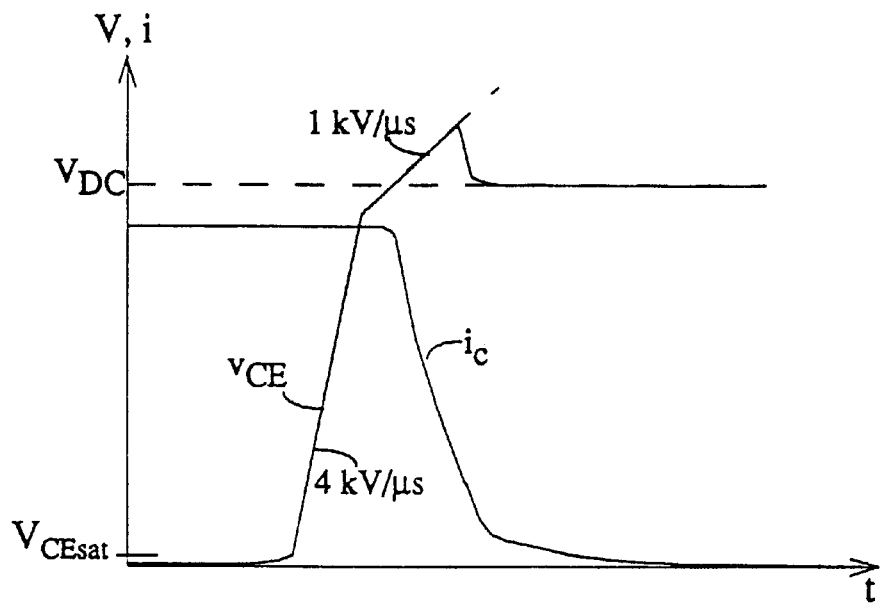
FIG. 3 shows an example of an ideal control of the voltage derivative dv/dt during turn-off of an IGBT to avoid overvoltages during, for example, turn-off of large currents in an inductive circuit or during series connection of a number of transistors.

During turn-off of the power transistor, the current source S2 is controlled by a gate drive controller GDC to deliver current during turn-off of the power transistor which is controlled by the drive, resulting in the voltage on the contact line 1 of the gate dropping. This causes the current source to extract charges from the gate. If the power transistor consists, for example, of an IGBT, the voltage of the gate drops to about +10 V before the transistor starts picking up a voltage $V_{CE} \gg V_{CEsat}$ (sat=saturation) across the main electrodes. The voltage on the gate at which this occurs is, however, greatly dependent on, inter alia, the current which flows through the transistor at this moment. During the initial stage of the voltage growth, the current source will substantially charge the internal Miller capacitance between the gate and the collector. As the voltage increases, however, this capacitance decreases and, at a voltage of the order of magnitude of 40 V, the external capacitor C2 will instead dominate. The voltage growth (dv/dt) will then be determined substantially by the current used by the current source S2 and by the capacitance value of the external capacitor C2 (FIG. 3).

According to the above described operations, the capacitor C2 will determine the voltage derivative of the transistor in cooperation with the current from the current source S1 during turn-on and the current source S2 during turn-off, respectively. In this way, the voltage derivatives during turn-on and turn-off may be chosen independently of each other. The size of the capacitor C2 is chosen such that it dominates over the Miller capacitance of the transistor at voltages exceeding, for example, 50–100 V. The current that the current sources S1 and S2 need to deliver is then controlled by the maximum voltage derivative during turn-on and turn-off, respectively, which is desired. The current that the current source S2 delivers then normally becomes so large that di/dt during turn-on becomes too large for an opposite diode if only the internal input capacitance of the transistor (between the gate and the emitter) is allowed to determine this. Then, an external capacitor C1 may be added between the gate and the emitter to limit the current derivative di/dt during turn-on to a value suitable for the opposite diode.

In this way, both di/dt and dv/dt during turn-on may be chosen largely independently of each other.

In order not to unnecessarily to increase the turn-on delay and the charge which is required for the turn-on operation, a Zener diode Z1 may be placed in series with the capacitor C1. During turn-off of the power transistor, the Zener diode Z1 becomes conducting and the capacitor C1 is charged to substantially the same voltage as the gate G of the power transistor, for example −5 V. The breakdown voltage of the Zener diode should therefore, in this example, be chosen approximately equal to 5 V+$V_{th}$, such that the Zener diode during turn-on of the power transistor starts conducting when the voltage of the gate G of the transistor has reached the voltage $V_{th}$. In this way, the capacitor C1 influences the whole turn-on operation from the moment when current starts flowing between the main electrodes of the power transistor. By a suitable choice of the voltage level of the gate in the off-state of the power transistor, it is also possible to prevent the capacitor C1 from influencing the turn-off operation of the power transistor. If, for example, $V_{th}$ is 5 V and the voltage level of the gate in the on-state of the power transistor is +15 V, the voltage level of the gate in the off-state of the power transistor should be ≦−5 V. A suitable breakdown voltage for this Zener diode is then ≧10 V, and when the power transistor is turned on, the capacitor mentioned has been recharged to more than approximately $V_{th}$, that is, +5 V. During the subsequent turn-off operation, the Zener diode Z1 will not, therefore, carry current until the voltage between the gate and the emitter of the power transistor falls below $V_{th}$. Then the capacitor C1 can no longer influence the turn-off process of the transistor.

Preferably both current sources S1 and S2 are voltage-limited.

The primary task of the Zener diodes Z2 and Z3 is to limit the voltage of the gate such that the voltage does not exceed (e.g. in connection with a short-circuit) or fall below values specified for the transistor.

At least two ways of controlling the gate drive controller GDC can be used. The two current sources S1 and S2, respectively, can be controlled to deliver a current which varies according to a predetermined process during the turn-on and turn-off operations, up to the time when the voltage of the gate has risen or dropped to a voltage level which lies near +15 V or −5 V, without the collector voltage $v_{CE}$ being sensed and where the gate drive controller is only supplied with an input signal In which provides information about the times for switching on and off the transistor.

Figure 6:
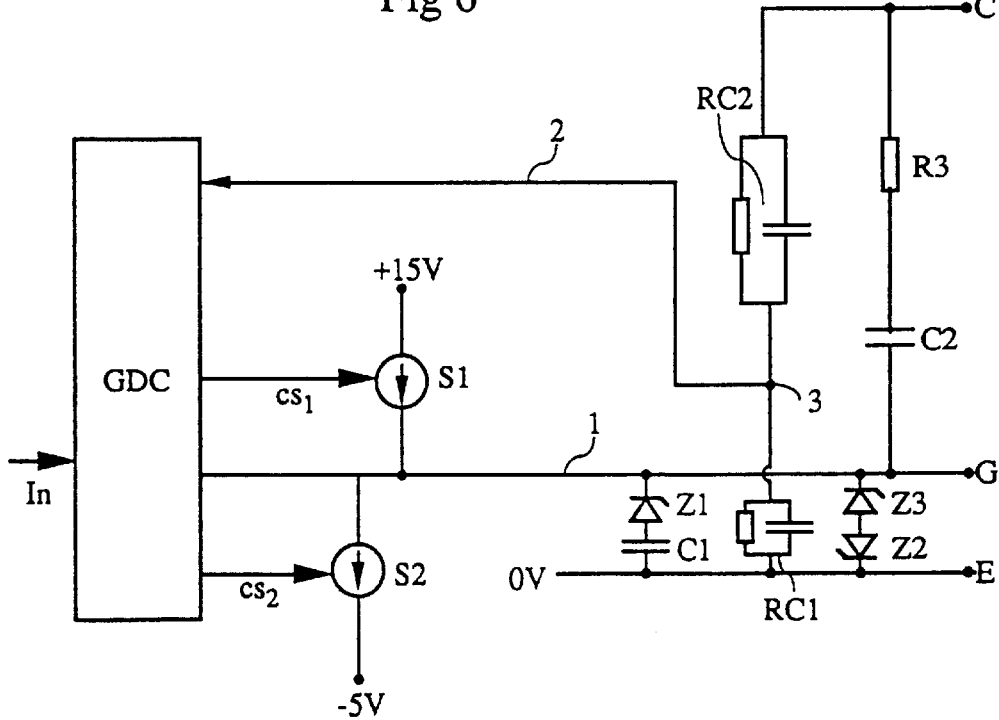
FIG. 6 illustrates an alternative embodiment for control of the power transistor according to the invention, wherein the control of di/dt and dv/dt for turn-on and dv/dt for turn-off may also depend on that collector voltage which arises across the transistor prior to and during said turn-on and turn-off operations, respectively.

In another embodiment of the invention, a broadband voltage divider, comprising the RC circuits RC1 and RC2, is connected in parallel with the emitter and collector connections of the power transistor (FIG. 6). Between these two RC circuits, a sensing line 2 for sensing the collector voltage $v_{CE}$ is then connected at the point 3. The voltage of this sensing line can then be used for controlling the gate drive controller GDC for increase of the current from the first and second current sources, respectively, to obtain the desired current and voltage derivatives according to the above during turn-on and turn-off, respectively. The gate drive controller GDC controls the current from the first S1 and the second S2 current source to be a predetermined function of the collector voltage $v_{CE}$. The dependence of the control signal on the collector voltage is thus described by the function cs1(t)=f($v_{CE}$(tau), tau≦t) as examples, where both instantaneous and/or historical values of $v_{CE}$ may be utilized to influence the control signal. This provides a possibility of creating, for example, a voltage derivative during turn-off according to FIG. 3, where the derivative is given different values step-by-step in dependence on the collector voltage. As an example, FIG. 3 shows a value 4 kV/$\mu$s for the derivative initially during the voltage growth across the transistor, whereas the value of the derivative is reduced to 1 kV/$\mu$s when the voltage approaches $V_{DC}$. Values other than those shown may, of course, be chosen. Also, the decreasing value of the voltage derivative may be caused to undergo more steps than two, or be varied continuously.

The gate drive controller GDC delivers two control signals, one control signal cs1 for control of the current source S1 during turn-on and one control signal cs2 for control of the current source S2 during turn-off of the power transistor. The gate drive controller GDC only utilizes known technique and will not be described in more detail here. The control signals cs1 and cs2, respectively, may be both digital and analog depending of the nature of the controlled current source.

Additionally, the current sources S1 and S2, respectively, are designed according to known techniques. Controllable current sources may be designed with ordinary transistor switches. If a very good temperature stability is desirable, a switch according to FIG. 7 may be used. The figure illustrates an example of a current source S2 according to the invention and constitutes in the exemplified case a modification of a current source of a kind which is marketed by, for example, Siliconix Incorporated. If a controllable current source with very good stability is desired, a larger number of digitally controlled current sources may also be used, the task of each of these current sources being to deliver a fixed current. It is then possible to achieve a current source which can be rapidly changed between a number of different values of delivered current in order to realize the above-mentioned control where the voltage derivative of the transistor can be given different values in dependence on the instantaneous value of the collector voltage.

The design of the current source S1 is the same as that described for S2.

Figure 7:
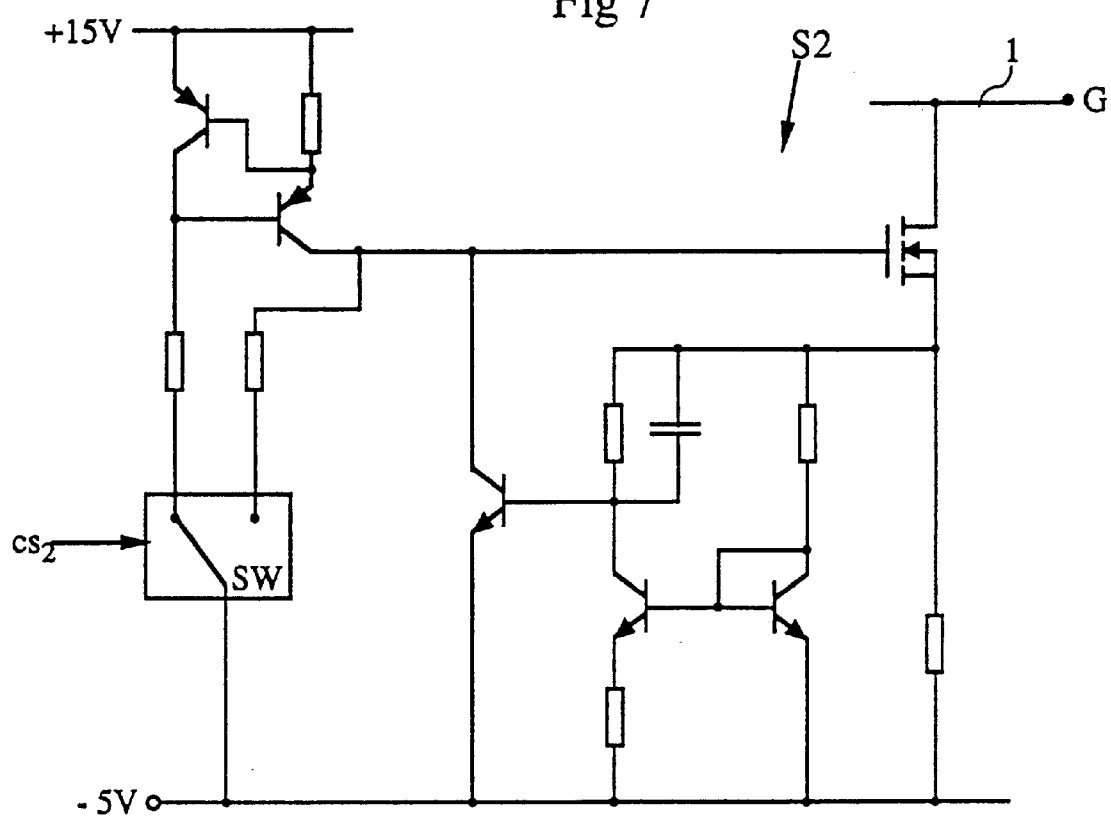
FIG. 7 shows an example of the design of a voltage-limited current source which delivers a stable current with a low temperature dependence, which is useful in those cases where it is desired to control a power transistor in a very well-defined manner, which may be the case in, for example, a series connection of a number of transistors according to the invention.

$cs_2$ is, in the example according to FIG. 7, a digital signal which controls the switch SW to change between two positions.

In the embodiments according to FIGS. 5 and 6, two controllable current sources are shown. If only one of the turn-on or turn-off operations needs optimized control, it is, of course, possible to utilize only one of the above-mentioned first and second current sources (S1, S2) together with the associated capacitor for control of the desired derivative according to the above. In such a case, the second current source is replaced with a conventional solution comprising a voltage source, a semiconductor switch and a resistor in accordance with FIG. 2.

We claim:

1. A method for controlling a turn-on operation of a voltage controlled power transistor having a gate, a first main electrode and a second main electrode, said method comprising the steps of:

operating a first current source to deliver current to the gate; and controlling a recharging of a capacitance between the gate and the first main electrode by means of the current delivered to the gate thus determining the time rate of change (di/dt) of the current (i) between the main electrodes of the power transistor during the turn-on operation;

delivering a current with a predetermined course of time by means of said current source; and controlling said current source by a control signal.

2. A method for controlling a turn-on operation of a voltage controlled power transistor having a gate, a first main electrode and a second main electrode, said method comprising the steps of:

operating a first current source to deliver current to the gate; and controlling a recharging of a capacitance between the gate and the second main electrode by means of the current delivered to the gate thus determining the time rate of change (dv/dt) of the voltage (v) across the main electrodes of the power transistor during the turn-on operation;

delivering a current with a predetermined course of time by means of said current source; and controlling said current source by a control signal.

3. A method according to claim 2 further comprising the steps of:

delivering a second control signal to a second current source; and controlling said second current source by said second control signal during turn-off of the power transistors such that a pre-determined rate of change of the voltage (dv/dt) during turn-off is obtained.

4. A method for controlling a turn-off operation of a voltage controlled power transistor having a gate, a first main electrode and a second main electrode, said method comprising the steps of:

operating a second current source to deliver current from the gate; and controlling a recharging of a capacitance between the gate and the second main electrode by means of the current delivered from the gate thus determining the time rate of change (dv/dt) of the voltage (v) across the main electrodes of the power transistor during the turn-off operation;

delivering a current with a predetermined course of time by means of said current source; and controlling said current source by a control signal.

5. A method according to claim 4 further comprising the steps of:

delivering a second control signal to said second current source; and controlling said second current source by said second control signal during turn-off of the power transistors such that a pre-determined rate of change of the voltage (dv/dt) during turn-off is obtained.

6. A method for controlling a turn-on operation of a voltage controlled power transistor having a gate, a first main electrode and a second main electrode, said method comprising the steps of:

operating a first current source to deliver current to the gate; and controlling a recharging of a capacitance between the gate and the first main electrode by means of the current delivered to the gate thus determining the time rate of change (di/dt) of the current (i) between the main electrodes of the power transistor during the turn-on operation;

delivering a current which is dependent on the actual value of the voltage (VCE) across the main electrodes by said current source; and controlling said current source by a control signal.

7. A method for controlling a turn-on operation of a voltage controlled power transistor having a gate, a first main electrode and a second main electrode, said method comprising the steps of:

operating a first current source to deliver current to the gate; and controlling a recharging of a capacitance between the gate and the first main electrode by means of the current delivered to the gate thus determining the time rate of change (di/dt) of the current (i) between the main electrodes of the power transistor during the turn-on operation delivering a current which is dependent on the actual value and the historical values of the voltage (VCE) across the main electrodes by said current source; and controlling said current source by a control signal.

8. A method according to claims 7, further comprising the step of:

controlling said current source by an analog control signal.

9. A method according to claim 7, further comprising the steps of:

composing a plurality of digitally controlled partial-current sources to form said current source, choosing the current from said current source by controlling each partial-current source individually; and controlling each partial-current source individually by assigning a control signal to each partial-current source.

10. A method according to claim 9, further, comprising the steps of:

delivering a first control signal from a gate drive controller to said first current source;

controlling said first current source by said first control signal to deliver a current during turn-on of the power transistor for obtaining a predetermined time rate of change of at least one of a) the current (di/dt) through the transistor, and b) the voltage (dv/dt) across the transistor.

11. A method according to claim 9, further comprising the steps of:

delivering a second control signal from a gate drive controller to said second current source;

controlling said second current source by said second control signal to deliver a current during turn-off of the power transistor for obtaining a predetermined time rate of change of the voltage (dv/dt) across the transistor.

12. A method according to claim 11, further comprising the step of:

controlling the current from said second current source by said second control signal to deliver a current during turn-off of the power transistor for obtaining decreasing values of the voltage derivative (dv/dt).

13. A device for controlling a switching operation in a voltage-controlled power transistor having a control electrode (G), a first main electrode (E) and a second main electrode (C) said device comprising:

at least one current source coupled to the control electrode;

a capacitance between the control electrode and one of the main electrodes;

wherein said at least one current source controls a recharging of said capacitance for controlling the time derivative of at least one from the group of: the derivative of the current (di/dt) through the transistor during turn-on of the transistor, the derivative of the voltage (dv/dt) across the transistor during turn-on of the transistor, the derivative of the voltage (dv/dt) across the transistor during turn-off of the transistor;

a second current source coupled to the control electrode (G) of the power transistor; and a second capacitance between the control electrode (G) and the second main electrode (C); and wherein said second current source controls a recharging of said second capacitance for determining the time derivative of the voltage (dv/dt) across the transistor during turn-off of the transistor.

14. A device according to claim 13, further comprising:

a first current source coupled to the control electrode (G) of the power transistor; and a second capacitance between the control electrode (G) and the second main electrode (C); and wherein said first current source controls a recharging of said second capacitance for determining the time derivative of the voltage (dv/dt) across the transistor during turn-on of the transistor.

15. A device according to claim 13, further comprising:

an external capacitor connected in parallel with the control electrode and the main electrode, whereby said capacitance is the sum of the values of said capacitor and a self-capacitance between the control electrode (G) of the power transistor and the main electrode.

16. A device according to claim 13, further comprising:

a plurality of digitally controlled partial-current sources together forming at least one of said first and second current sources.

17. A device according to claim 13, further comprising:

a first current source coupled to the control electrode (G) of the power transistor; and a first capacitance between the control electrode (G) and the first main electrode (E); and wherein said first current source controls a recharging of said first capacitance for determining the time derivative of the current (di/dt) through the transistor during turn-on of the transistor.

18. A device according to claim 17, further comprising:

a gate drive controller (GDC) for generating control signals controlling said first and said second current sources to deliver predetermined currents during the turn-on and turn-off operations, respectively.

19. A device according to claim 18, further comprising:

a voltage divider coupled between said first main electrode and said second main electrode of the transistor for sensing the voltage across the transistor and for generating a feedback signal being supplied to said gate drive controller, whereby the current from at least one of said current sources is controlled by means of a control signal being a function of said sensed voltage.

20. A device according to claim 18, further comprising:

a voltage divider coupled between said first main electrode and said second main electrode of the transistor for sensing the voltage across the transistor and for generating a feedback signal being supplied to said gate drive controller, whereby the current from at least one of said current sources is controlled by means of a control signal being a function of the instantaneous value and historical values of said sensed voltage.

21. A method for controlling a turn-on operation of a voltage controlled power transistor having a gate, a first main electrode and a second main electrode, said method comprising the steps of:

operating a first current source to deliver current to the gate; and controlling a recharging of a capacitance between the gate and the second main electrode by means of the current delivered to the gate thus determining the time rate of change (dv/dt) of the voltage (v) across the main electrodes of the power transistor during the turn-on operation;

delivering a current which is dependent on the actual value of the voltage (VCE) across the main electrodes by said current source; and controlling said current source by a control signal.

22. A method for controlling a turn-on operation of a voltage controlled power transistor having a gate, a first main electrode and a second main electrode, said method comprising the steps of:

operating a first current source to deliver current to the gate; and controlling a recharging of a capacitance between the gate and the second main electrode by means of the current delivered to the gate thus determining the time rate of change (dv/dt) of the voltage (v) across the main electrodes of the power transistor during the turn-on operation;

delivering a current which is dependent on the actual value and the historical values of the voltage (VCE) across the main electrodes by said current source; and controlling said current source by a control signal.

23. A method according to claims 22, further comprising the step of:

controlling said current source by an analog control signal.

24. A method according to claim 22, further comprising the steps of:

composing a plurality of digitally controlled partial-current sources to form said current source, choosing the current from said current source by controlling each partial-current source individually; and controlling each partial-current source individually by assigning a control signal to each partial-current source.

25. A method according to claim 24, further, comprising the steps of:

delivering a first control signal from a gate drive controller to said first current source;

controlling said first current source by said first control signal to deliver a current during turn-on of the power transistor for obtaining a predetermined time rate of change of at least one of a) the current (di/dt) through the transistor, and b) the voltage (dv/dt) across the transistor.

26. A method according to claim 24, further comprising the steps of:

delivering a second control signal from a gate drive controller to a second current source;

controlling said second current source by said second control signal to deliver a current during turn-off of the power transistor for obtaining a predetermined time rate of change of the voltage (dv/dt) across the transistor.

27. A method according to claim 26, further comprising the step of:

controlling the current from said second current source by said second control signal to deliver a current during turn-off of the power transistor for obtaining decreasing values of the voltage derivative (dv/dt).

28. A method for controlling a turn-off operation of a voltage controlled power transistor having a gate, a first main electrode and a second main electrode, said method comprising the steps of:

operating a second current source to deliver current from the gate; and controlling a recharging of a capacitance between the gate and the second main electrode by means of the current delivered from the gate thus determining the time rate of change (dv/dt) of the voltage (v) across the main electrodes of the power transistor during the turn-off operation;

delivering a current which is dependent on the actual value of the voltage (VCE) across the main electrodes by said current source; and controlling said current source by a control signal.

29. A method for controlling a turn-off operation of a voltage controlled power transistor having a gate, a first main electrode and a second main electrode, said method comprising the steps of:

operating a second current source to deliver current from the gate; and controlling a recharging of a capacitance between the gate and the second main electrode by means of the current delivered from the gate thus determining the time rate of change (dv/dt) of the voltage (v) across the main electrodes of the power transistor during the turn-off operation;

delivering a current which is dependent on the actual value and the historical values of the voltage (VCE) across the main electrodes by said current source; and controlling said current source by a control signal.

30. A method according to claim 29, further comprising the steps of:

composing a plurality of digitally controlled partial-current sources to form said current source, choosing the current from said current source by controlling each partial-current source individually; and controlling each partial-current source individually by assigning a control signal to each partial-current source.

31. A method according to claims 29, further comprising the step of: controlling said current source by an analog control signal.

32. A method according to claim 31, further, comprising the steps of:

delivering a first control signal from a gate drive controller to said first current source;

controlling said first current source by said first control signal to deliver a current during turn-on of the power transistor for obtaining a predetermined time rate of change of at least one of a) the current (di/dt) through the transistor, and b) the voltage (dv/dt) across the transistor.

33. A method according to claim 31, further comprising the steps of:

delivering a second control signal from a gate drive controller to said second current source;

controlling said second current source by said second control signal to deliver a current during turn-off of the power transistor for obtaining a predetermined time rate of change of the voltage (dv/dt) across the transistor.

34. A method according to claim 33, further comprising the step of:

controlling the current from said second current source by said second control signal to deliver a current during turn-off of the power transistor for obtaining decreasing values of the voltage derivative (dv/dt).

* * * * *